United States Patent
Pfeuffer et al.

(10) Patent No.: US 9,753,108 B2
(45) Date of Patent: Sep. 5, 2017

(54) MAGNETIC RESONANCE IMAGING METHOD FOR AT LEAST TWO SEPARATE RADIO-FREQUENCY TRANSMIT COILS WITH TIME-DELAYED SLICE-SELECTIVE EXCITATION PULSES

(71) Applicants: Josef Pfeuffer, Kunreuth (DE); Rainer Schneider, Erlangen (DE)

(72) Inventors: Josef Pfeuffer, Kunreuth (DE); Rainer Schneider, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 334 days.

(21) Appl. No.: 14/678,484

(22) Filed: Apr. 3, 2015

(65) Prior Publication Data

US 2015/0285877 A1 Oct. 8, 2015

(30) Foreign Application Priority Data

Apr. 3, 2014 (DE) .................. 10 2014 206 398

(51) Int. Cl.
*G01V 3/00* (2006.01)
*G01R 33/44* (2006.01)
(Continued)

(52) U.S. Cl.
CPC ..... *G01R 33/443* (2013.01); *G01R 33/34092* (2013.01); *G01R 33/385* (2013.01);
(Continued)

(58) Field of Classification Search
CPC .................................................. G01R 33/443
(Continued)

(56) References Cited

U.S. PATENT DOCUMENTS

| 9,542,763 B2 * | 1/2017 | Bilgic | G01R 33/243 |
| 2015/0323635 A1 * | 11/2015 | Haacke | G01R 33/5616 |
| | | | 324/309 |
| 2015/0338492 A1 * | 11/2015 | Sato | G01R 33/5608 |
| | | | 600/410 |

OTHER PUBLICATIONS

Anderson Robert, et.al. :"Simultaneous Multislice Spectral-Spatial Excitations for Reduced Signal Loss Susceptibility Artifact in BOLD Functional MRI", in: Magnetic Resonance in Medicine, pp. 1-11, 2013.

(Continued)

*Primary Examiner* — Louis Arana
(74) *Attorney, Agent, or Firm* — Lempia Summerfield Katz LLC

(57) ABSTRACT

A method for creating an image data set using a magnetic resonance system including at least two RF transmit coils includes, for each RF transmit coil, calculating a value for a susceptibility magnetic field gradient to be corrected from the $G_s$ map in combination with the B1 map of the RF transmit coil. The method includes, for each RF transmit coil, calculating a time delay of the excitation pulse. The method also includes calculating a complex weighting factor for scaling the pulse profile for each RF transmit coil to achieve an as uniform as possible deflection of the magnetization by the excitation pulse over the area under examination, and passing through the imaging sequence. The RF transmit coils each emit an excitation pulse with the calculated time delay and with a pulse profile scaled according to the calculated complex weighting factors.

18 Claims, 3 Drawing Sheets

(51) Int. Cl.
  G01R 33/34    (2006.01)
  G01R 33/385   (2006.01)
  G01R 33/387   (2006.01)
  G01R 33/56    (2006.01)
  G01R 33/561   (2006.01)
  G01R 33/565   (2006.01)

(52) U.S. Cl.
  CPC ....... *G01R 33/387* (2013.01); *G01R 33/5608* (2013.01); *G01R 33/5613* (2013.01); *G01R 33/5616* (2013.01); *G01R 33/56536* (2013.01); *G01R 33/56563* (2013.01); *G01R 33/5659* (2013.01)

(58) Field of Classification Search
  USPC .................................. 324/318, 322, 309, 314
  See application file for complete search history.

(56) References Cited

OTHER PUBLICATIONS

Chen Nan-Kuei,et.al. :"Selection of voxel size and slice orientation for fMRI in the presence of susceptibility field gradients: application to imaging of the amygdala", in: NeuroImage, vol. 19, 2003.
Constable R.Todd et.al.: "Composite Image Formation in Z-Shimmed Functional MR Imaging" in: Magnetic Resonance in Medicine, vol. 42, pp. 1, 1999.
Dagher, J., et al., "High-Resolution, Large Dynamic Range FieldMap Estimation", Magnetic Resonance in Medicine, vol. 71, pp. 105-117, 2014.
Deng Weiran et.al.: "Simultaneous Z-Shim Method for Reducing Susceptibility Artifacts With Multiple Transmitters", in: Magnetic Resonance in Medicine, vol. 61, pp. 255-259, 2009.
Fautz, H-P-, et.al.: "B1 mapping of coil arrays for parallel transmission", in: Proc. Intl. Soc. Mag. Reson. Med., vol. 16, p. 1247, 2008.
German Notice of Allowance for related German Application No. 10 2014 206 398.1 dated Jul. 17, 2016, with English Translation.
German Office Action for German Application No. 10 2014 206 398.1, mailed Mar. 2, 2015, with English Translation.
Glover Gary et.al. :"3D z-Shim Method for Reduction of SusceptibilityEffect in BOLD fMRI", in: Magnetic Resonance in Medicine vol. 42, pp. 290-299 (1999).
Grissom William et al., "Spatial Domain Method for the Design of RF Pulses in Multicoil Parallel Excitation", in: Magnetic Resonance in Medicine vol. 56, pp. 620-629; 2006.
Haacke E.M. et al:"Reduction of T2 Dephasing in Gradient Field-Echo-Imaging1", in: Radiology 1989, vol. 170, pp. 457-462.
Heberlein Keith Arron, et.al. :"Simultaneous Acquisition of Gradient-Echo and Asymmetric Spin-Echo for Single-Shot Z-Shim: Z-SAGA", in: Magnetic Resonance in Medicine, vol. 51, pp. 212-216, 2004.
Hsu Jung-Jiin,et.al. :"Mitigation of Susceptibility-Induced Signal Loss in Neuroimaging Using Localized Shim Coils" Magnetic Resonance in Medicine, vol. 53, pp. 243-248, 2005.
Schneider Rainer, et.al. : "Fully automated simultaneous z-shim method for reduced susceptibility induced signal loss with parallel transmission at 3T", pp. 1-18.
Schneider Rainer, et.al.: "Local Signal Recovery in Clinical FLASH Imaging with Parallel Transmission."
Stenger V. Andrew,et.al. :"Three-Dimensional Tailored RF Pulses for the Reduction of Susceptibility Artifacts in T*2-Weighted Functional MRI", in: Magnetic Resonance in Medicine, vol. 44, pp. 525-531, 2000.
Sutton, B. P., et al., "Fast, Iterative Image Reconstruction for MRI in the Presence of Field Inhomogeneities", IEEE Transactions on Medical Imaging, vol. 22, No. 2, Feb. 2003.
Ullman, Peter, et.al.: "Experimental Analysis of Excitation Using Dedicated Coil Setups and Simultaneous RF Transmission on Multiple Channels", in: Magnetic Resonance in Medicine, vol. 54, pp. 994-1001, Sep. 9, 2005.
W. Song Allen:"Single-Shot EPI With Signal Recovery From the Susceptibility-Induced Losses", in: Magnetic Resonance in Medicine, vol. 46, pp, 407-411, 2001.
Wilson James L., et.al.:"Utilization of an Intra-Oral Diamagnetic Passive Shim in Functional MRI of the Inferior Frontal Cortex" in: Magnetic Resonance in Medicine, vol. 50, pp. 1089-1094, 2003.
Yang Cungeng et.al. :"Simple Analytical Dual-Band Spectral-Spatial RF Pulses for B1l and Susceptibility Artifact Reduction in Gradient Echo MRI", in: Magnetic Resonance in Medicine, vol. 65, pp. 370-376, 2011.
Yang Cungeng, et.al.: "Four-Dimensional Spectral-Spatial RF Pulses for Simultaneous Correction of B1l Inhomogeneity and Susceptibility Artifacts in T2*-Weighted MRI", in: Magnetic Resonance in Medicine, vol. 64, pp. 1-8, 2010.
Yip Chun-yu et al: "Advanced Three-Dimensional Tailored RF Pulse for Signal Recovery in T*2-Weighted Functional Magnetic Resonance Imaging", in: Magnetic Resonance in Medicine, vol. 56, p. 1050-1059, 2006.
Yip Chun-Yu et.al.: "Spectral-Spatial Pulse Design for Through-Plane Phase Precompensatory Slice Selection in T* 2-Weighted Functional MRI", in: Magnetic Resonance in Medicine, vol. 61, pp. 1137-1147, 2009.
Zheng Hai, et.al. :"Multi-slice parallel transmission three-dimensional tailored RF (PTX 3DTRF) pulse design for signal recovery in ultra high field functional MRI", in: Journal of Magnetic Resonance, vol. 228, pp. 37-44, 2013.
Altendorfer, H., E. Fuhrmann, and C. Torker. "Concepts for hot dip galvanising of HR strip." Steel Times International 20.6 (1996): 12.

* cited by examiner

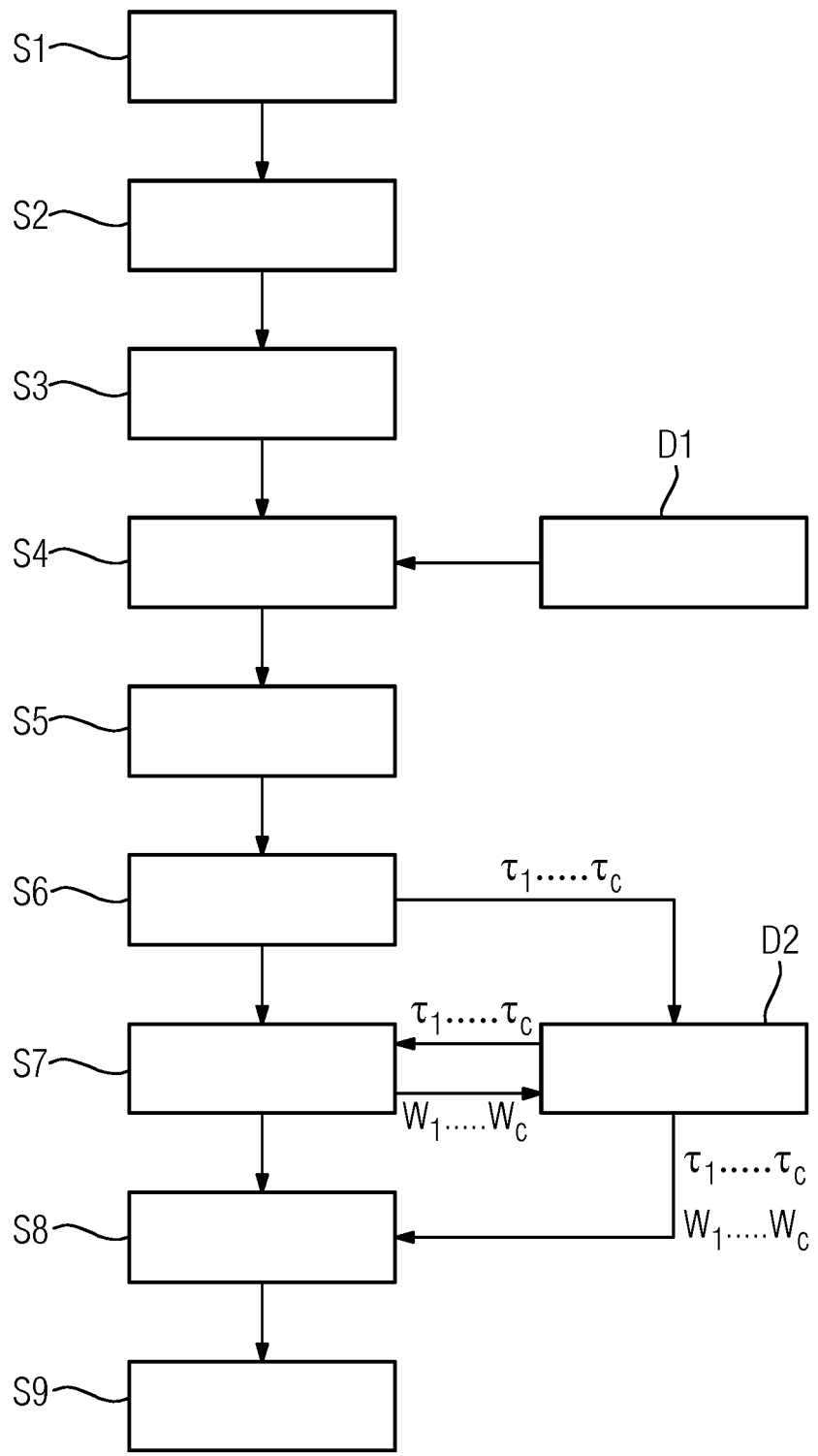

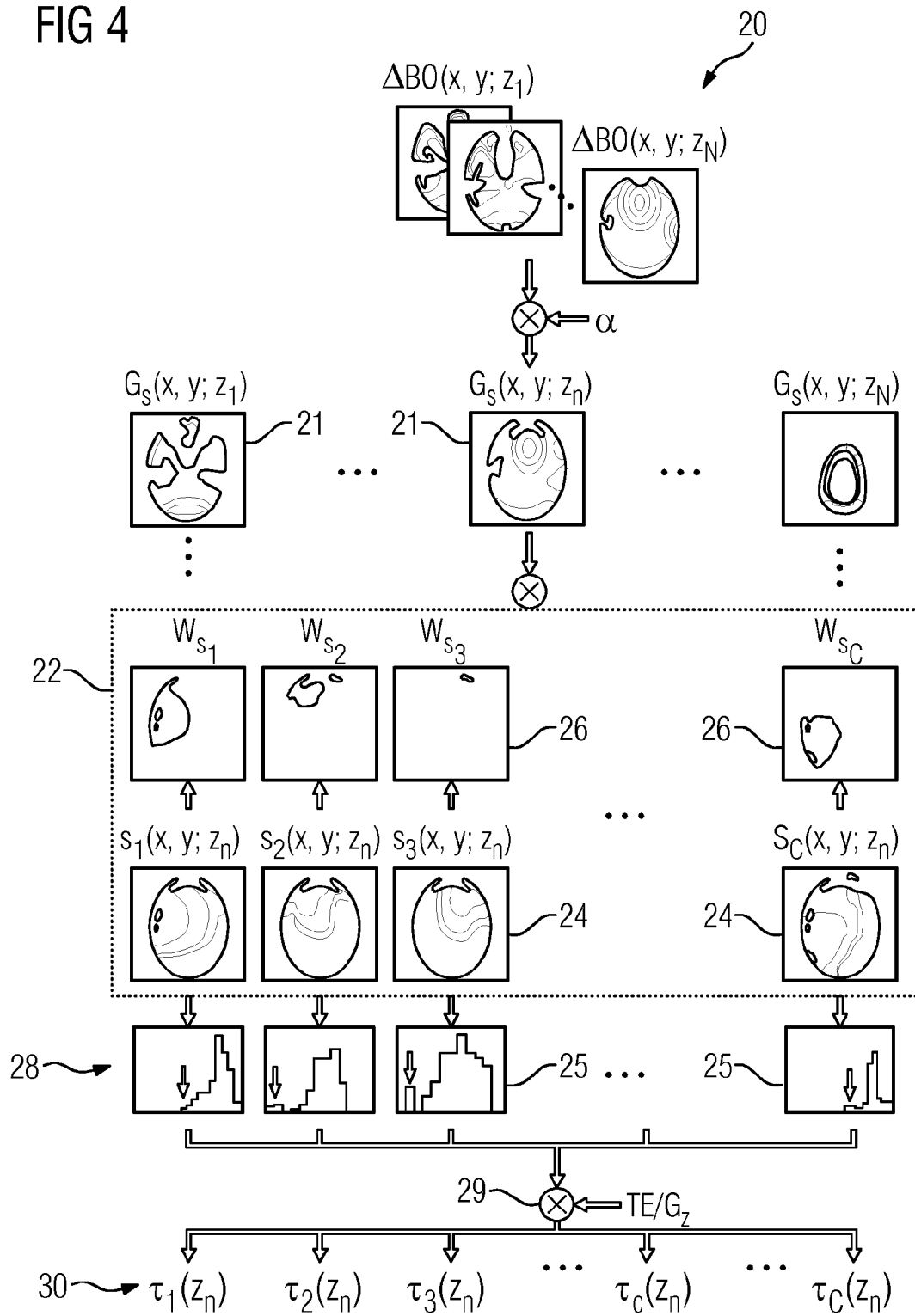

MAGNETIC RESONANCE IMAGING METHOD FOR AT LEAST TWO SEPARATE RADIO-FREQUENCY TRANSMIT COILS WITH TIME-DELAYED SLICE-SELECTIVE EXCITATION PULSES

This application claims the benefit of DE 10 2014 206 398.1, filed on Apr. 3, 2014, which is hereby incorporated by reference in its entirety.

FIELD

The present embodiments relate to creating an image data set of an area under examination with magnetic resonance tomography (MRT) using a magnetic resonance system including at least two RF transmit coils.

BACKGROUND

The signal loss due to susceptibility artifacts in $T_2^*$-weighted magnetic-resonance tomography images is a disadvantage of gradient-echo-based sequences such as, for example, FLASH, echo-planar imaging (EPI) and susceptibility weighted imaging (SWI). This problem is acute with radio-frequency MRT, but also with standard field strengths for clinical devices of, for example, 1.5 T. This signal loss occurs due to the fact that introducing the patient into the main magnetic field of a magnetic resonance system disrupts the homogeneity of the main magnetic field because different body tissues have different susceptibilities and therefore result in distortions of the magnetic field. This effect is particularly pronounced at severe susceptibility changes (e.g., at the transition between air and tissue), such as that which occurs, for example, at the frontal and paranasal sinuses in the head. These susceptibility magnetic field gradients, and hence gradients in the main magnetic field, dephase the Spins more quickly (e.g., $T_2^*$ is shorter) and this dephasing may not be reversed by a gradient echo. Therefore, in the human brain, significant signal losses mainly occur in the frontal-orbital and inferior-temporal cortices and may significantly complicate the diagnosis of, for example, stroke and cerebral hemorrhage. In the case of a typical alignment of the slice images through the brain (e.g., parallel to the underside of the bar on a sagittal image), which corresponds approximately to an axial alignment, the signal void is particularly dominated by the component of the magnetic field gradient in the direction of the slice thickness (e.g., "through-plane component"). This negative effect is further intensified with lengthy echo times, such as are, for example, required for blood oxygen level-dependent (BOLD) functional magnetic resonance images (fMRIs).

Different approaches were suggested in the past to resolve this problem. For example, z-shim methods, with which z-gradients of different strengths are switched after the excitation pulse, exist. However, this uses numerous sub-images and hence extends the recording time. Additional $B_0$ shim coils or diamagnetic shim materials may reduce the local inhomogeneity of the main magnetic field and hence the signal losses. However, this may requires manual intervention and is uncomfortable for the patient.

In the article by Weiran Deng, "Simultaneous Z-Shim-Method for Reducing Susceptibility Artifacts With Multiple Transmitters," Magnetic Resonance in Medicine 61:255-259 (2009), it was suggested that a plurality of RF transmit coils be used. The slice-selective excitation pulse on the different RF transmit coils is to be sent with a different time shift in each case. This should result in a phase gradient that compensates the gradient in the main magnetic field in the direction of the slice thickness (e.g., with an exactly axial alignment of the slices in the Z direction). This is based on the knowledge that, with a slice-selective gradient $G_z$, a time shift or time delay $\tau_c$ of the excitation pulse with the RF pulse profile $b_c(t)$, where c designates the respective RF transmit coil, results in a linear phase shift along the slice profile m(z) (e.g., in the direction of the slice thickness). This is based on the formalism of the Fourier transformation, where a shift in the time domain generates a linear phase in the frequency domain. This is also known as the z-shim method. Deng suggests a simultaneous z-shim method for multiple RF transmit coils. The RF transmit pulses are sent with different time delays on separate RF transmit coils. The summation of the z-shims occurs automatically due to the parallel transmission. If the different RF transmit coils are sensitive in different ranges, this may also enable the magnetic field inhomogeneities that vary spatially over the area under examination to be compensated. Deng et al. demonstrated this with a local 4-channel head coil. However, this revealed strong $B_1$ inhomogeneity effects that impair the image. No methods are suggested as to how the time delays may be calculated. Instead, the time delays were set manually. This makes this method unsuitable for clinical practice.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an imaging method for magnetic resonance systems based on a z-shim method that permits the automatic determination of an optimal time delay between individual transmit pulses is provided.

As another example, $B_1$ inhomogeneity effects are reduced.

The imaging method according to one or more of the present embodiments may be executed on any magnetic resonance system with at least two radio-frequency (RF) transmit channels so that at least two RF transmit coils may each send an excitation pulse with a prespecified pulse profile with a time delay in each case. In on embodiment, the at least two RF transmit coils may be controlled completely independently of one another. The excitation pulses are slice-selective so that the area under examination may be a slice through an object to be examined (e.g., through a human or animal body). The objects to be examined may be different organs and body parts (e.g., head, chest, abdomen or limbs). The method may also be used with multislice imaging sequences with which several slices may be excited simultaneously.

The imaging sequence may be a gradient-echo sequence (e.g., a T2*-weighted sequence such as a sequence for use with BOLD fMRIs). Suitable imaging sequences are, for example, fast low angle shot (FLASH), susceptibility weighted imaging (SWI) or echo-planar imaging (EPI).

The method includes a first act in which $B_1$ maps are accessed. The $B_1$ maps represent the spatial distribution of the sensitivity of the at least two RF transmit coils over the area under examination. This, for example, entails two-dimensional data sets $s_c$ that for each RF transmit coil and for each slice indicate how sensitive the respective RF coil is at each point or pixel within this slice. These $B_1$ maps may be obtained by known $B_1$ mapping methods or are prespecified for each RF transmit coil. However, the method is one in which, following the positioning of the patient in the magnetic resonance system, the $B_1$ maps are each determined experimentally with pulse sequences specially provided for this purpose.

In a further act, which may take place chronologically before or after the aforementioned act, a $G_s$ map representing the spatial distribution of susceptibility magnetic field gradients in the area under examination is accessed. This includes gradients in the main magnetic field (e.g., in the direction through the slice profile or in the direction of the slice thickness (z direction)) that are occasioned by changes in susceptibility in the object to be examined (e.g., at the interfaces between air and tissue at the air pockets in the brain). The $G_s$ map may be obtained in a different way, as described below.

In a chronologically subsequent act, for example, a value for a susceptibility magnetic field gradient to be corrected is calculated from the $G_s$ map in combination with the $B_1$ map of the RF transmit coil for each RF transmit coil. The aim of the calculation is to find a typical or the maximum susceptibility magnetic field gradient for precisely the range in which the respective RF transmit coil is sensitive. This value to be corrected may then namely be compensated by a corresponding time delay of the slice-selective excitation pulse of this RF transmit coil. There are also several possibilities for this calculation, which are explained in more detail below.

In a next act, a time delay of the excitation pulse is calculated for each RF transmit coil based on the susceptibility magnetic field gradient to be corrected, the slice gradient to be applied during the excitation pulse, and the echo time of the imaging sequence. For example, the product of slice gradient multiplied by the time delay should be the same as the product of susceptibility magnetic field gradient and echo time in order to achieve an as accurate as possible compensation of the dephasing based on the susceptibility magnetic field gradient.

When the time delay for each RF transmit coil has been calculated, in a next act, a complex weighting factor for scaling the pulse profile for each RF transmit coil is calculated. This complex (e.g., including a real and an imaginary part) weighting factor is optimized such that an as uniform as possible magnetization profile is achieved over the area under examination (e.g., over the slice in the slice plane). The calculation takes into account at least the $B_1$ maps. An exemplary embodiment of this optimization problem is explained in more detail below. An as uniform as possible "lighting" of the slice (e.g., an image that is as smooth, attractive and homogeneous as possible) may be achieved.

In a next act, the imaging sequence is traversed. The RF transmit coils each emit an excitation pulse with the calculated time delay and with a pulse profile scaled according to the calculated complex weighting during the simultaneous application of a slice gradient. In one embodiment, the same pulse profile or the same static wave shape p is used for each excitation pulse. The strength and phase of the pulse is then set with the complex weighting factor.

The method according to one or more of the present embodiments has the advantage that signal voids due to susceptibility magnetic field gradients (e.g., in the direction of the slice thickness) may be compensated. Contrary to the method known from the prior art, it is not necessary to set the time delay manually, but the time delay is calculated automatically. This makes the compensation more precise, and additionally, a method of this kind is also suitable for the routine clinical practice.

A further advantage includes that $B_1$ inhomogeneities are compensated as far as possible and once again by an automatic calculation of the complex weighting factors. This enables the production of a more homogeneous slice image, which in turn also makes diagnosis easier.

A further advantage of the method according to one or more of the present embodiments includes the fact that a prespecified pulse profile that is only multiplied with a weighting factor for the individual RF transmit coils is used. This provides that it is not necessary to calculate an optimized excitation pulse for each RF transmit coil, and this reduces the computational effort.

Another advantage with the method according to one or more of the present embodiments is the fact that $B_1$ and $B_0$ maps are anyway determined in the majority of MRT examinations after the positioning of the patient or test subject in the magnetic resonance system. Hence, the method according to one or more of the present embodiments does not extend the length of the examination.

The advantages occur, for example, with gradient echo sequences on the skull (e.g., in the frontal-orbital cortex and with high main magnetic field strengths).

According to one embodiment, the $G_s$ map may be calculated from a $B_0$ map (also called $\Delta B_0(x)$), which represents the spatial distribution of the main magnetic field inhomogeneity in the area under examination. This may involve in each case the deviation from the main magnetic field (e.g., average main magnetic field), therefore also called $\Delta B_0(x)$, which may be positive or negative. This may in turn be determined by corresponding $B_0$ mapping methods (e.g., after a person to be examined has been positioned in the magnetic field system). This may take place by corresponding derivation in the spatial directions as long as the $B_0$ map is available with adequate resolution. However, a simpler method is also possible, and a linear dependence of the susceptibility magnetic field gradient of the magnetic field inhomogeneity stored in the $B_0$ map may be assumed for the calculation of the $G_s$ map. The proportionality factor $\alpha$ may have values of between $-1.0$ and $-2.0$ $\mu T/m/Hz$. This is derived from the consideration that the gradient of the main magnetic field is high at those places where the deviation or inhomogeneity is also particularly high. This is only an approximation but provides sufficiently good results for the purposes of the present embodiments.

Alternatively, the $G_s$ map may also be obtained by accessing a standard susceptibility distribution or a standard magnetic field distribution, which is stored in a database for a body part to be examined. For example, a standard $G_s$ map may be designed for a typical human skull with typical susceptibility magnetic field gradients in the human head. This map may optionally (e.g., by registration methods) be adapted to the individual dimensions and position of the skull to be examined.

With the method according to one or more of the present embodiments, with which different time delays are used for the different RF transmit coils, each time delay of the excitation pulse in each case generates a linear phase gradient over the slice profile, which is suitable in each case to compensate a specific value for a magnetic field gradient by the slice profile. A single value for a susceptibility magnetic field gradient to be corrected is to be defined for each RF transmit coil. The $G_s$ map is used for this but is weighted with the $B_1$ map of the RF transmit coil, which may take place in different ways. For example, the susceptibility magnetic field gradient to be corrected may be assumed to be the maximum susceptibility magnetic field gradient within the sensitive regions of the RF coil (e.g., described by the $B_1$ map).

According to one or more of the present embodiments, a threshold value is applied to the $B_1$ map of the RF transmit coil in order to determine the sensitive region of the RF transmit coil.

According to another embodiment, which may be applied additionally to the threshold value method, the $B_1$ map is normalized and applied as spatial weighting to the $G_s$ map (e.g., the $B_1$ map is normalized such that the $B_1$ map only has values between 0 and 1). These values are then multiplied with the $G_s$ map, and the greatest value present is then assumed to be the maximum susceptibility magnetic field gradient within the sensitive region of the RF coil and the time shift calculated on this basis. This has the advantage that, due to the time shift of its excitation pulse, each RF coil compensates as precisely as possible the susceptibility magnetic field gradient that predominates in the region excited thereby (e.g., the sensitive region of this RF transmit coil). This enables the achievement of the best possible signal recovery over the entire area under examination.

Alternatively to the use of the maximum susceptibility magnetic field gradient within the sensitive region of the respective RF transmit coil, another value may be used (e.g., the average susceptibility magnetic field gradient within the sensitive region). According to another embodiment, the mean value plus one standard deviation, the mean value plus two standard deviations, or the mean value plus three standard deviations may be used. Compared to the use of the highest or maximum susceptibility magnetic field gradient within the sensitive region of the RF transmit coil, this has the advantage that outliers are not able to distort the result.

A further possibility is the use of the "trimmed maximum." A histogram of the distribution of the susceptibility magnetic field gradients within the sensitive region of the RF transmit coil, for example, is formulated. The maximum is determined, and a specific percentage (e.g., 5%) is deducted therefrom.

Hence, these different statistical estimations are used to calculate a slice- and coil-specific time delay of the excitation pulse calculated.

In one or more of the present embodiments, the at least two RF transmit coils have sensitive regions that do not precisely overlap. The method also functions, however, if the RF transmit coils have very strongly overlapping sensitive regions but are non-identical. This is not be the case, however, if two different RF transmit coils are used (e.g., if two or more local RF transmit coils are used).

The threshold value may, for example, be defined such that the respective sensitive regions of the individual RF transmit coils overlap slightly, but not so strongly that, for example, the entire area under examination lies in at least one sensitive region of a coil; the degree of overlapping may be as small as possible. In one embodiment, the same threshold value is used for each RF transmit coil, but different threshold values may be used.

To achieve an as uniform as possible deflection of the (equilibrium) magnetization by the excitation pulse over the area under examination (e.g., over a specific slice), where this substantially provides the uniformity within the slice plane (and not over the slice thickness), the prespecified pulse profile of the excitation pulse for each RF transmit coil is weighted with a complex weighting factor. According to the method according to one or more of the present embodiments, this is automatically calculated. The calculation at least takes into account the $B_1$ maps (e.g., the sensitivity profiles of the RF transmit coils over the area under examination). The complex weighting factors are weighted such that the flip angle is as similar as possible over the entire area under examination (e.g., in that that the respective strength of the excitation pulses on the RF coils is optimized accordingly). If a region is reached by a plurality of RF transmit coils, the effects of the respective excitation pulses, including respective time delay, which have already been defined in advance, are combined or added to one another.

According to one embodiment, therefore, the calculation of the complex weighting factors takes account of not only the $B_1$ maps, but also of the k-space trajectory of the excitation pulse. This trajectory k(t) is defined as the time-reversed integration of the gradient wave shapes (e.g., of the slice gradient) applied during the excitation pulse.

In addition, according to one embodiment, the prespecified pulse profile and/or the $B_0$ map and/or the calculated time delays of the excitation pulses are also taken into account.

The effect of the respective time-delayed slice-selective excitation pulses on the different RF transmit coils may be calculated as precisely as possible. In one embodiment, an equation that reflects the effect of the prespecified pulse profile, in each case weighted with the complex weighting factors, with the application of the predetermined slice gradient, and taking into account the $B_1$ and optionally $B_0$ maps (e.g., in the form of a matrix or vector equation) is formulated. The target magnetization (e.g., an as flat as possible magnetization profile over the entire slice or the entire area under examination) is deducted, and the amount of this difference is minimized. Mathematically, this may be represented in one embodiment by the amount obtained from the product of a total system matrix with the optimized pulse profile minus the target magnetization, which is minimized.

According to one embodiment, during the minimization method, a regularization term is also added. According to one embodiment, this may be a Tikhonov regularization term, such as described in the article by W. Grissom in Magnetic Resonance in Medicine 56:620-629 (2006).

According to one embodiment, at the start of the method, a user-defined SNR value is accessed. The user-defined SNR value determines a degree of the possible signal loss due to the time delay and is taken into account during the calculation of the time delay. This is based on the knowledge that a time shift between the individual excitation pulses may also cause the slice profile to be reduced, which in turn has negative impacts on the signal-to-noise (SNR) ratio. Therefore, this is a trade-off between the signal-to-noise-ratio and an as optimal as possible correction to the susceptibility artifacts resulting from the $B_0$ inhomogeneities. According to one embodiment, the user may strike his own balance. During the calculation of the time delay, it is then, for example, possible to maintain the signal-to-noise-ratio in that a maximum value is used for the time delay of the excitation pulses.

The pulse profile of the excitation pulse may have a sinc wave shape. However, other RF pulse types may also be provided (e.g., 2 DRF pulses that each have a sequence of several sub-pulses). These are, for example, used jointly with EPI spokes trajectories. The method according to one or more of the present embodiments may be applied to all types of pulse shapes and types of excitation pulses (e.g., to pulse shapes that are displayed with a gradient).

One or more of the present embodiments are also directed to a magnetic resonance system including at least one gradient coil for generating a gradient field and at least two RF transmit coils. Each of the at least two RF transmit coils includes a transmit channel for generating radio-frequency pulses. The magnetic resonance system also includes a control device that controls the magnetic resonance system. The control device is, for example, able to switch the gradient coils and control the RF transmit coils via the transmit channels such that specific excitation pulses are transmitted. In addition, the control device also controls the data acquisition. The control device is, for example, part of a console, a computer, a PC, laptop, tablet computer or even a mobile device (e.g., a smartphone). The control device is configured to carry out the method. The control device is, for example, able to control the magnetic resonance system such that the control device carries out the method according to one or more of the present embodiments. The RF transmit coils may also simultaneously be receive coils (e.g., receive the MR signal).

The magnetic resonance system may have a main magnetic field of 1.5 T, 2 T, or 3 T, for example. The magnetic resonance system may be a high-field system. The magnetic resonance system may, for example, be an MR scanner with two fully integrated whole-body transmit channels or transmit coils (e.g., Siemens Magnetom Prisma and Skyra).

In addition, one or more of the present embodiments are also directed at a digital storage medium (e.g., a non-transitory computer-readable storage medium) including a software program with program code portions (e.g., instructions) that cause a magnetic resonance system to carry out the method according to one or more of the present embodiments when the software program is executed on the magnetic resonance system. The software program is executed on the control device that controls the magnetic resonance system. One or more of the present embodiments are also directed to a corresponding software program.

Mathematical Background

If, during the acquisition of a gradient echo image, a susceptibility magnetic field gradient was primarily present in the direction through the slice thickness, as is, for example, the case in axial slice images above the air pockets in the brain, the image $I(x,y)$, that is generated with a slice-selective RF pulse at the time TE, may then be calculated as follows:

$$I(x,y)=\int M(x,y,z)m(z)e^{i\gamma G_s(x,y)z \cdot TE}dz. \quad [1]$$

$G_s(x,y)$ is the spatially varying susceptibility magnetic field gradient in the direction of the slice thickness (e.g., "through-plane direction"), and $m(z)$ is the slice profile. $M(x,y,z)$ designates the equilibrium magnetization available at each point. Phase cancellation due to integration in the z direction (e.g., over the slice thickness) will result in signal losses in $I(x,y)$.

With the z-shim approach, a time-delayed slice-selective excitation pulse is used in order to apply a linear phase gradient along the slice profile, which may compensate the spatially varying susceptibility magnetic field gradients in this direction. In the present of a slice-selective gradient $G_z$, therefore, an RF pulse delayed by the time delay $\tau$ with the pulse profile $b(t)$ results in a phase term along the slice profile $m(z)$. In the case of a plurality of RF transmit coils with transmit channels independent of one another, a simultaneous z-shim may be achieved in that the same pulse profile $b(t)$ is transmitted on C different transmit channels, but with an individual time delay $\tau_c$ (see Deng et al.).

$$b_c(t+\tau_c) \leftrightarrow m(z)e^{i\gamma G_z \tau_c}, \quad [2]$$

Here, $b_c(t+\tau_c)$ is the RF pulse profile on the c-th transmit channel delayed by $\tau_c$.

If the same pulse profile $b(t)$ is always used, an increase in the time delay $\tau_c$ of this pulse profile increases the steepness of the phase gradient along the slice profile. This enables the phase gradient to be adapted to the susceptibility magnetic field gradient $G_s$.

Ideally, the time delay $T_c$ may be individually adapted at the slice position $z_n$ of N slices such that the phase variation due to the susceptibility magnetic field gradient in the Z direction is precisely compensated at a given echo time TE:

$$G_z \cdot \tau_c(z_n) = G_s(x,y;z_n) \cdot TE \quad [3]$$

Here, $G_z$ is the slice gradient applied during the excitation pulse. In principle, this approach is not able to compensate a spatially varying phase gradient since the linear phase imposed is applied globally along the slice profile $m(z)$ independently of the x,y coordinates within the slice. The spatially localized sensitivity profile $s_c$ of the RF transmit coils, which describes the sensitive region of the respective RF transmit coil, allows a certain degree of spatially varying phase distributions when the RF transmit coils with spatially different sensitivity profiles $s_c$ each have different time delays $T_c$.

In order to obtain a value for $G_s$, according to one embodiment, the approximation, according to which the susceptibility magnetic field gradient $G_s$ may be approximately derived from the $B_0$ map (e.g., a map of the deviations of the main magnetic field from the basic magnetic field strength or a map of the main magnetic field inhomogeneities $\Delta B_0(x,y;z_n)$), may be applied. For example, it has been demonstrated that a linear relationship with a slope $\alpha$ in the region of about −1.0 to −2.0 µT/m/Hz provides reasonable results (see Chun-Yu Yip et al "Spectro-Spatial pulses Design for Through-Plane Phase Precompensatory Slice Selection in $T_2$*-Weighted Functional MRI," Magnetic Resonance in Medicine 61:1137-1147 (2009)). The $B_0$ maps derivable by known methods may be used to calculate the gradients induced by susceptibility differences in the main magnetic field along the slice profile, which are responsible for the signal losses:

$$G_s(x,y;z_n) = \alpha \cdot \Delta B_0(x,y;z_n) \quad [4]$$

Hence, therefore, the $B_0$ map determined during an MR examination may in any case be used, for example, for purposes of RF pulse optimization, and no additional settings are required. After inserting these assumptions in formula 3, the slice-specific and RF-transmit-coil-specific time delay may be calculated using the following formula:

$$\tau_c(z_n) = \frac{\alpha \cdot \max[\Delta B_0(x, y; z_n)]_{w_{s_c}} \cdot TE}{G_z}, \quad [5]$$

where $\alpha$ is the slope describing the functional relationship between the field strength offset and the field gradient through the slice profile, and $\max[\Delta B_0(x,y;z_n)]$ is the strongest field strength offset and hence the most critical susceptibility magnetic field gradient within the sensitive regions of the respective RF transmit coil or the coil-specific region of interest (RoI) $W_{s_c}$. The coil-specific RoI is, for example, defined in that the spatial sensitivity profile $s_c(x,y;z_n)$ is subjected in a suitable way to a threshold value in order to localize the influence of the c-th RF transmit coil. In the case of strongly overlapping sensitive regions of the individual RF transmit coils, the problem of assigning a respective suitable RF transmit coil to a given spatial distribution of the field gradient due to susceptibility effects $G_s(x,y;z_n)$ is relatively demanding. A value for a susceptibility field gradient to be corrected iteratively, correlated with the sensitivity profiles of the RF transmit coils (e.g., the $B_1$ maps) and then excluded by $G_s(x,y;z_n)$ in order to find suitable time delays $\tau_c$, may, however, be determined.

If suitable $\tau_c$ are determined, a suitable complex weighting factor for scaling the pulse profile may be calculated for each RF transmit coil in order to achieve an as uniform as possible deflection of the magnetization by the excitation pulse over the area under examination (e.g., over the entire slice (in the x,y direction)). The following procedure is used for this.

Assuming small flip angles, the spatial distribution of the deflected magnetization (e.g., the magnetization in the transversal plane generated by an individual RF transmit coil) is approximated by the Fourier integral of a deflection K-space trajectory $k(t)=[k_x(t) k_y(t) k_z(t)]$, weighted by a complex pulse profile b(t), and spatially weighted by the complex sensitivity profile $s_c(x)$ of the respective RF transmit coil:

$$m(x) = i\gamma m_0 s(x) \int_0^T b(t) e^{i\gamma \Delta B_0(x)(t-T)} e^{ix \cdot k(t)} dt \qquad [6]$$

Here, $\gamma$ is the gyromagnetic ratio, $m_0$ is the size of the equilibrium magnetization, T is the pulse length, and $e^{i\gamma \Delta B_0(x)(t-T)}$ represents the phase formed due to the inhomogeneities in the main magnetic field that are defined by the $B_0$ map $\Delta B_0(x)$. The trajectory k(t) is defined as the time-reversed integration of the gradient wave shape (see P. Ullmann et al, Magnetic Resonance in Medicine 54:994-1001 (2005)). If use is made of the linearity in the region of the small flip angle, the excitation profile of multiple RF transmit coils may be spatially superposed in order to form a complex pattern:

$$m(x) = i\gamma m_0 \sum_{c=1}^{C} s_c(x) \int_0^T b_c(t) e^{i\gamma \Delta B_0(x)(t-T)} e^{ix \cdot k(t)} dt. \qquad [7]$$

C is the number of RF transmit coils each with a sensitivity pattern $s_c(x)$ and a RF pulse profile M(t). If these formulae are discretized, and in the time domain with $N_t$ points and in the spatial domain with $N_s$ points, this may be written as follows:

$$m = \sum_{c=1}^{C} S_c A b_c \qquad [8]$$

where m is a vector with the length $N_s$ of spatial scanning points of the superposed excitation pattern, $S_c=\text{diag}\{s_c(x_i)\}$ is a diagonal matrix containing scanning points of the sensitivity pattern of the coil c, and $b_c$ is a vector of the length $N_t$ of scanning points that represents the RF pulse of the RF transmit coil c. The (ij)th Element of the $N_s \times N_t$ system matrix A is provided by $$a_{ij} = i\gamma m_0 \Delta t e^{i\gamma \Delta B_0(x_i)(t_j-T)} e^{ix_i \cdot k(t_j)} \qquad [9]$$

Formula 8 may be rewritten by horizontal concatenation of the matrices $S_c A$ and vertical concatenation of the vectors $b_c$ as:

$$m = [S_1 A \ldots S_C A] \begin{bmatrix} b_1 \\ \vdots \\ b_C \end{bmatrix} = A_{full} b_{full} \qquad [10]$$

The vector $m_{des}$, which contains $N_s$ scanning points of a desired magnetization profile at the spatial points $x_i$, is used for m. For example, a flat magnetization profile is used over x,y in the respective slice in order to achieve an as uniform as possible deflection of the magnetization over the slice and hence the lowest possible $B_1$ inhomogeneities.

This then gives rise to the following minimization problem, which is to be resolved in order to obtain an optimized RF pulse b.

$$\hat{b}_{full} = \underset{b_{full}}{\operatorname{argmin}} \{\|A_{full} b_{full} - m_{des}\|_w^2 + R(b_{full})\} \qquad [11]$$

W designates the region of interest as, for example, an $N_s \times N_s$ diagonal matrix that contains an error weighting, which may be used, for example, to exclude regions in the image without spins from the region of interest. $R(b_{full})$ designates a general regularization term that is a function of the RF scanning points. The regularization term R(b) used is, for example, the Tikhonov regularization with $\beta \|b_{full}\|_2^2$.

$A_{full}$ is the total system matrix.

This $B_1$ optimization problem is similar to the normal RF shimming approach, with which a flat target magnetization m is to be optimized.

For this purpose, specific complex weighting factors $w_c$ are introduced for each RF transmit channel, which optimally scale a static RF wave shape or an RF pulse profile p, $b_c = w_c p$. However, contrary to conventional RF shimming, the static RF pulse profile is not transmitted simultaneously on all C transmit channels. Instead, the start of the wave shape p differs from channel to channel due to the introduced time shift $\tau_c$:

$$b_c(t_j) = w_c \cdot p(t_j - t_{center} + N_p/2 - \tau_c) \qquad [12]$$

where $t_j = 1 \ldots N_t$ and $k(t_{center}) = 0$.

Here, $b_c$ is the discretized RF wave shape of the c-th RF transmit channel with $N_t$ scanning points in time, $t_{center}$ is the time at which the excitation trajectory in the k-space k passes through the center of the k-space, and $N_p$ is the number of scanning points of the static wave shape p.

The total system matrix A is also to be specified and is concatenated by RF channel-specific system matrices $\tilde{A}_c$ and diagonal matrices $\tilde{S}_c$ containing the information on the RF coil sensitivity $s_c$ at the spatial coordinates x with $N_s$ scanning points:

$$A = [\tilde{S}_1 \tilde{A}_1 \ldots \tilde{S}_C \tilde{A}_C] \text{ wherein } \tilde{S}_c = \text{diag}\{s_c(x)\} \qquad [13]$$

The i-th spatial element $a_{ic}$ of the system matrices $\tilde{A}_c$ contains further information on the temporal course of the k-space trajectory k and the evolving off-resonance effects that form due to the inhomogeneities in the main magnetic field $\Delta B_0$ throughout the entire pulse duration $T_{pulse} = N_t \Delta t$.

$$a_{ic} = \sum_{j=t_{center}-N_p/2+\tau_c}^{t_{center}+N_p/2+\tau_c} i\gamma m_0 \Delta t e^{ix_i k(t_j)} \qquad [14]$$

$$e^{i\gamma \Delta B_0(x_i)(t_j - T_{pulse})} p(j - t_{center} + N_p/2 - \tau_c)$$

Here, the time dimension may be compressed by the factor $N_p$ since the wave shape p is static, and hence, p is transferred from the solution vector $b_e$ to the matrix $\tilde{A}_c$. Hence, as with RF shimming, the final dimensions of $A=N_s \times C$. However, the composition of A differs slightly for $\Delta t_c \neq 0$.

The minimization problem may be resolved in different ways (e.g., by inversion or by the conjugate-gradient (CG) method), as described in the article by W. P. Sutton in IEEE Transactions in Medical Imaging; 22:178-188 (2003).

This minimization may thus be used to find values for w, (e.g., a complex weighting factor for each RF transmit coil with which the static pulse profile p, which is prespecified, is weighted).

BRIEF DESCRIPTION OF THE DRAWINGS

FIG. 3 shows a flow diagram of one embodiment of a method;

FIG. 4 shows a sequence diagram of a part of one embodiment of the method.

DETAILED DESCRIPTION

Figure 1:
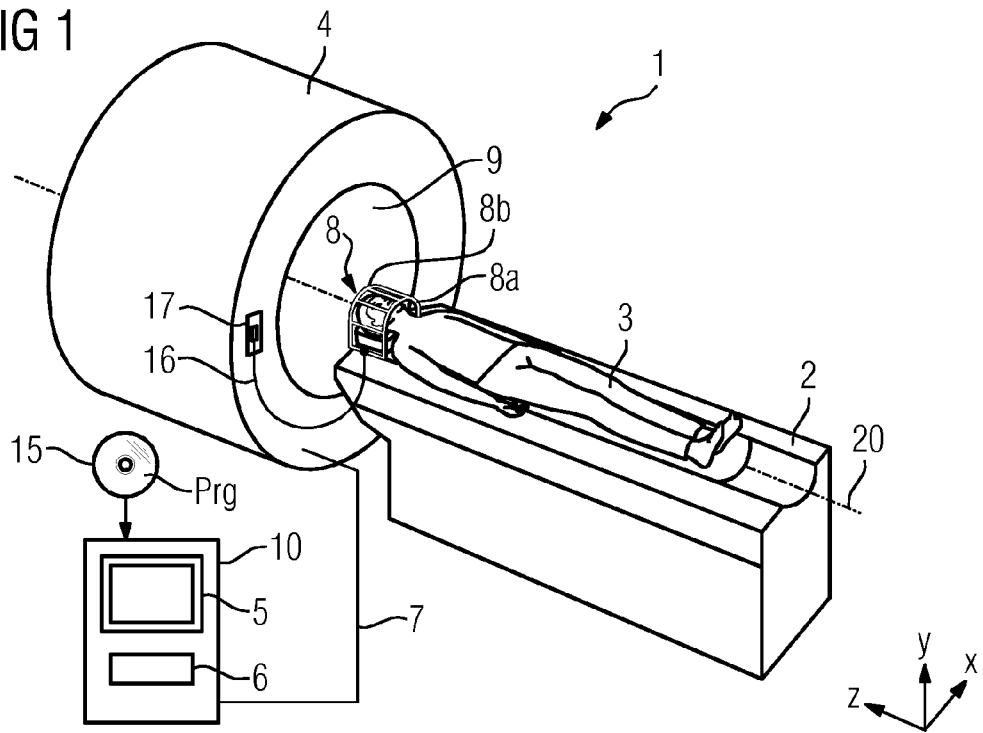
FIG. 1 shows a simplified perspective representation of one embodiment of a magnetic resonance system.

With reference to FIG. 1, in the embodiment shown, a magnetic resonance system 1 includes a main magnet 4 with an inner space 9. A patient 3 lies on a patient bed 2 that may be moved along an axis of the device 20 into the inner space 9.

In the example shown, the head of the patient 3 is placed in a head coil 8, which is, for example, made up of two separate RF transmit coils 8*a* and 8*b*. Other exemplary embodiments may be provided. For example, the two RF transmit coils 8*a* and 8*b* may also be embodied as whole-body coils and permanently integrated in the magnetic resonance system 1. In one embodiment, more than two RF transmit coils may be provided. For example, head coils including four RF transmit coils each arranged concentrically about an axis may be provided.

The head coil 8 is connected by a cable loom 16 to a connection 17 and, like all other components of the magnetic resonance system 1, is controlled by a control unit 6 (e.g., a controller, a processor). This is typically integrated in an operator console 10. The control unit 6 may be part of a computer (e.g., the central processing unit (CPU). Memory modules (e.g., a hard disc or a RAM or other data storage media for storing predetermined values, pulse profiles etc.) may also be part of the control unit 6. The operator console 10 also includes a screen 5 and optionally an input device such as a keyboard and a mouse (not shown), which enable a user to input data (e.g., an SNR value). A software program including program code portions Prg for carrying out the method according to one or more of the present embodiments may be stored on a digital storage medium 15 (e.g., a digital, optical or magnetic data storage device such as a CD-ROM) and in this way may be uploaded into the control unit 6.

Figure 2:
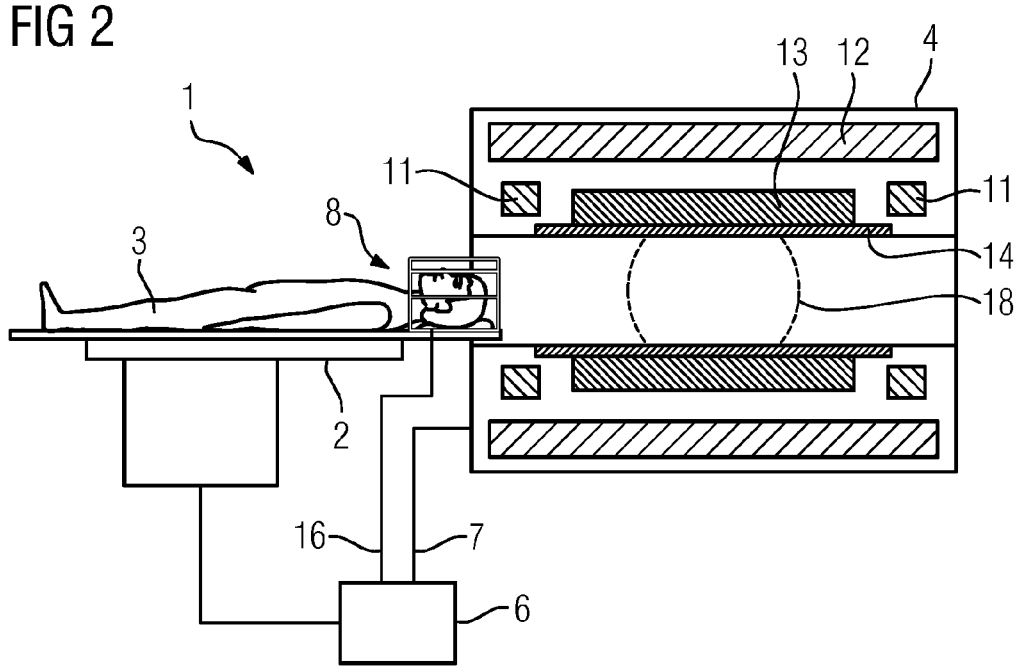
FIG. 2 shows a longitudinal section through the magnetic resonance system 1.

FIG. 2 shows the bed 2 again in longitudinal section with the patient 3 positioned thereupon. The head of the patient is placed in the head coil 8, which is made up of two independent RF transmit coils 8*a* and 8*b*. The head coil 8 is connected to the control device 6 via the cable 16. The control device 6 also controls the other components of the magnetic resonance system 1 via the lines 7. These components include, for example, the main magnet 4. This includes, for example, the coil 12, which generates the main magnetic field and is made of superconducting material. There is also a gradient system 13 including at least one gradient coil to generate a gradient field. Shim coils 11 are also depicted schematically. An RF body coil is designated with the reference number 14. The depiction in FIG. 2 is purely schematic, and the spatial arrangement of these components may be different from that shown. Further components of the magnetic resonance system, such as, for example, ADCs, frequency generators, amplifiers, filters and other converters are not shown in this figure.

The main magnet 4 generates a strong main magnetic field, which, in particular, within the region 18, is sufficiently homogeneous for the acquisition of magnetic resonance data (e.g., image data).

FIG. 3 is a schematic sequence diagram of the method according to one or more of the present embodiments. In act S1, a patient is mounted in the magnetic resonance system, and corresponding RF transmit coils are selected or positioned on the part of the patient's body to be examined if the RF transmit coils are local coils. In act S2, a known $B_1$ mapping method is used to measure the spatial distribution of the sensitivity of the at least two RF transmit coils and, for example, in the area under examination or over the surface of the slice or slices to be examined. The measured sensitivities are each stored in corresponding image data sets, each corresponding to the individual slices to be examined. In act S3, the inhomogeneities of the main magnetic field $B_0$ are measured with corresponding $B_0$ mapping methods. The measured data is stored in corresponding image data sets, each corresponding to a slice to be measured. In one embodiment, only the deviation from the main magnetic field or the mean value of the statistical magnetic field in the area under examination is stored.

In act S4, a $G_s$ map depicting the spatial distribution of the magnetic field gradient in the area under examination is calculated from the $B_0$ map for the area under examination or the slice to be examined. This is performed with the aid of stored information D1 (e.g., under the assumption of a linear dependence of the magnetic field gradient on the deviation of the magnetic field from the mean value). Corresponding proportionality factors are, for example, values between −1.0 to −2.0 µT/m/Hz.

In act S5, for each RF transmit coil, a value for a susceptibility magnetic field gradient to be corrected is calculated from the $G_s$ map in combination with the $B_1$ map of the RF transmit coil. In one embodiment, a histogram of all magnetic field gradients within a sensitive region of the RF transmit coil, which is determined, for example, using the threshold value method, is formulated. Either the mean value of this statistical distribution or a particularly high value thereof is determined. The mean value or the particularly high value of the statistical distribution is defined as the susceptibility magnetic field gradient, the effect of which on the dephasing of the spins in the direction of the slice thickness is to be compensated by a time delay of the RF excitation pulse.

In act S6, a corresponding time delay $\tau_1 \ldots \tau_c$ is calculated based on this susceptibility magnetic field gradient to be corrected and the slice gradient and the echo time of the imaging sequence, and is stored in the data set D2.

Taking into account these time delays and further data stored in D2 (e.g., the $B_1$ maps), in act S7, a complex weighting factor for scaling the pulse profile for each RF transmit coil is calculated. The complex weighting factors are optimized such that an as uniform as possible (e.g., a maximally uniform) deflection of the magnetization by the excitation pulse or the excitation pulses of all RF transmit coils over the area under examination is achieved.

In act S8, the selected gradient echo imaging sequence is passed through. During the application of a slice gradient, the RF transmit coils each emit an excitation pulse with the calculated time delay and with a pulse profile scaled according to the calculated complex weighting factors.

Acts S4 to S6 are shown more precisely in FIG. 4.

Here, 20 designates the $B_0$ maps for each slice to be examined. Corresponding $G_s$ maps are calculated therefrom. For example, a $G_s$ map is calculated for each of the slices to be examined 1, . . . , N, by multiplying the slope $\alpha$.

These represent a linear estimation of the susceptibility magnetic field gradient in the direction of the slice thickness z.

In act 22, the $B_1$ maps are used. Of these, there is a number of C $B_1$ maps for each slice n, where C indicates the number of RF transmit coils. In FIG. 4, in each case, the sensitivity profiles of the coils 1, 2, 3 and C are only shown schematically for the slice n. In this case, it is evident from the sensitivity profiles that the RF transmit coils are arranged somewhat concentrically about a head. The $B_1$ maps are then subjected to a threshold value method. This defines a sensitive region or region of interest $W_{s1}$, . . . , $W_{SC}$ for each coil. As shown, the sensitive regions W of the individual RF transmit coils overlap slightly, but not much. This is favorable in order to be able to optimize the RF transmit pulses to the susceptibility magnetic field gradients in each case. However, a suitable value to be corrected for each RF transmit coil is to be found. In act 28, a histogram 25 of all magnetic field gradients within the respective region of interest W stored in the $B_1$ maps is formulated for each RF transmit coil. In the histograms 25, the maximum value of the magnetic field gradient, the highest value, is in each case marked with an arrow. In this exemplary embodiment, this value is assumed to be a susceptibility magnetic field gradient to be corrected. The value is then multiplied with the echo time TE of the imaging sequence and divided by the slice gradient $G_z$ which then produces the respective time delays $\tau_1$, . . . , $\tau_c$. If a plurality of slices are to be measured during the imaging sequence, acts 22, 28, 29 are each also performed for the other slices 1, 2, 3, . . . , N.

Experimental Examples

An embodiment of the method was carried out on a 3 T Magnetom Skyra magnetic resonance system (Siemens, Erlangen, Germany) using a multi-slice gradient-echo-based FLASH sequence. The images were acquired with a field of view of 240×240 mm², resolution 256×256 points, 26 slices, slice thickness 5 mm, TE/TR 20/600 milliseconds, a GRAPPA acceleration factor 2, and a flip angle of 25 degrees.

The complex sensitivity profiles for the RF coils (e.g., $B_1$ maps) were measured with the aid of presaturation turbo-FLASH-sequence, as described in H. P. Fautz et al "$B_1$-Mapping of Coil Arrays for Parallel Transmission," Proceedings of the 16th Annual Meeting of the ISMRM-Toronto, Canada 2008, 1247.

A $B_0$ map with fat-water in-phase was calculated on the basis of a multi-echo approach, similarly to as described in the article by J. Dagher et al, Magnetic Resonance in Medicine 71:105-117 (2014). The $B_0$ map obtained in this way was used during both the calculation of the slice-specific and RF-transmit coil-specific time delays and the calculation of the complex weighting factors.

The time delays were calculated with Mathlab 8.0 (Mathworks, Natick, Mass.) using a magnitude-least-squares approach. Using Hamming-filtered, RF sinc pulse profiles were used as static slice-selective RF wave forms or pulse profiles p and discretized with $N_p$=200 [scanning] points. In order to avoid an excessive change to the slice profile, the maximum time delay was limited to 50% of the duration of the main sinc lobe. At least one RF channel transmits without a time delay in order to define the standard signal-echo-time relationship (e.g., the RF channel with the originally lowest value for the time delay). The slice gradient was set at 19 mT/m. All pulses were regularized so that the pulses remained within the limits set by the RF Hardware and SAR.

The measurements were performed with two independent and fully integrated whole-body coils.

The time delay was adapted in order to achieve the best compromise between the local compensation of the susceptibility magnetic field gradients and SNR level ($\tau$=300 µs) and to optimize the compensation of the signal loss (e.g., $\tau$=800 µs). The slices were set by the skull.

For comparison, the same pulse sequence was also performed without a time delay (e.g., with the standard RF sinc excitation pulse).

The images acquired with the standard excitation pulse suffered from strong susceptibility artifacts in the frontal-orbital and temporal cortex. In the center of the image, there was also some obscuration due to $B_1$ effects (e.g., $B_1$ shading). Contrary to this, the images taken with the time delay of the excitation pulses according to one or more of the present embodiments have significantly less signal loss and less $B_1$ shading effects. The signal level may be retained, and up to 50% of the signal may be obtained in areas suffering from susceptibility magnetic field gradients in the direction of the slice thickness. The entire signal may be recovered, but at the expense of the SNR, as demonstrated by the measurements with $\tau$=800 µs.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for creating an image data set of an area under examination using a magnetic resonance system comprising at least two RF transmit coils, wherein at least one slice-selective excitation pulse with a prespecified pulse profile is applied to the area under examination during acquisition of image data by an imaging sequence, the method comprising:

accessing $B_1$ maps that represent a spatial distribution of the sensitivity of the at least two RF transmit coils over the area under examination;

accessing a Gs map that represents a spatial distribution of susceptibility magnetic field gradients in the area under examination;

for each RF transmit coil of the at least two RF transmit coils, calculating a value for a susceptibility magnetic field gradient to be corrected from the Gs map in combination with the $B_1$ map of the RF transmit coil;

for each RF transmit coil of the at least two RF transmit coils, calculating a time delay of the excitation pulse based on the susceptibility magnetic field gradient to be corrected, a slice gradient to be applied during the excitation pulse, and an echo time of the imaging sequence;

calculating a complex weighting factor for scaling a pulse profile for each RF transmit coil of the at least two RF transmit coils to achieve an as uniform as possible deflection of the magnetization by the excitation pulse over the area under examination, wherein the calculation takes into account at least the $B_1$ maps; and passing through the imaging sequence, wherein, during a simultaneous application of a slice gradient, the at least two RF transmit coils each emit an excitation pulse with the calculated time delay and with a pulse profile scaled according to the calculated complex weighting factors.

2. The method of claim 1, wherein the Gs map is calculated from a $B_0$ map that represents the spatial distribution of a main magnetic field inhomogeneity in the area under examination.

3. The method of claim 2, wherein for the calculation of the Gs map, a linear dependence of the susceptibility magnetic field gradient on the magnetic field inhomogeneity stored in the $B_0$ map is assumed.

4. The method of claim 1, wherein accessing the Gs map comprises accessing a standard susceptibility distribution that is stored in a database for a body part to be examined.

5. The method of claim 2, wherein, at the start of the method, the method further comprises:
  positioning a person to be examined in the area under examination; and
  determining the $B_0$ map, the $B_1$ maps, or the $B_0$ map and the $B_1$ maps by $B_0$ mapping methods, $B_1$ mapping methods, or $B_0$ mapping methods and $B_1$ mapping methods, respectively.

6. The method of claim 1, wherein the value for the susceptibility magnetic field gradient is the highest susceptibility magnetic field gradient within a sensitive region of the RF transmit coil.

7. The method of claim 1, wherein, during the calculation of the value for the susceptibility magnetic field gradient to be corrected, a threshold value is applied to the $B_1$ map of the RF transmit coil in order to determine a sensitive region of the RF transmit coil.

8. The method of claim 1, wherein the $B_1$ map is normalized, and during the calculation of the value for the susceptibility magnetic field gradient to be corrected, the $B_1$ map is applied as spatial weighting to the Gs map.

9. The method of claim 1, wherein during the calculation of the complex weighting factor for scaling the pulse profile, the $B_0$ map is taken into account.

10. The method of claim 1, wherein, during the calculation of the complex weighting factor for scaling the pulse profile, a k-space trajectory of the excitation pulse and the calculated time delays of the excitation pulses are taken into account.

11. The method of claim 1, wherein calculating the complex weighting factor comprises minimizing the product of a total system matrix with an optimized pulse profile minus a target magnetization.

12. The method of claim 1, wherein, at the start of the method, the method further comprises accessing a user-defined signal-to-noise ration (SNR) value that determines a degree of a possible signal loss due to the time delay, the user-defined SNR value being taken into account during the calculation of the time delay.

13. A magnetic resonance system comprising:
  at least one gradient coil operable to generate a gradient field;
  at least two transmit coils, each transmit coil of the at least two transmit coils comprising with an RF transmit channel operable to generate radio-frequency pulses; and
  a controller configured to create an image data set of an area under examination using the magnetic resonance system, wherein at least one slice-selective excitation pulse with a prespecified pulse profile is applied to the area under examination during acquisition of image data by an imaging sequence, the controller being further configured to:
    access $B_1$ maps that represent a spatial distribution of the sensitivity of the at least two RF transmit coils over the area under examination;
    access a Gs map that represents a spatial distribution of susceptibility magnetic field gradients in the area under examination;
    for each RF transmit coil of the at least two RF transmit coils, calculate a value for a susceptibility magnetic field gradient to be corrected from the Gs map in combination with the $B_1$ map of the RF transmit coil;
    for each RF transmit coil of the at least two RF transmit coils, calculate a time delay of the excitation pulse based on the susceptibility magnetic field gradient to be corrected, a slice gradient to be applied during the excitation pulse, and an echo time of the imaging sequence;
    calculate a complex weighting factor for scaling a pulse profile for each RF transmit coil of the at least two RF transmit coils to achieve a maximally uniform deflection of the magnetization by the excitation pulse over the area under examination, wherein the calculation takes into account at least the $B_1$ maps; and
    pass through the imaging sequence, wherein, during a simultaneous application of a slice gradient, the at least two RF transmit coils each emit an excitation pulse with the calculated time delay and with a pulse profile scaled according to the calculated complex weighting factors.

14. In a non-transitory computer-readable storage medium that stores instructions executable by a magnetic resonance system to create an image data set of an area under examination, the magnetic resonance system comprising at least two RF transmit coils, wherein at least one slice-selective excitation pulse with a prespecified pulse profile is applied to the area under examination during acquisition of image data by an imaging sequence, the instructions comprising:
  accessing $B_1$ maps that represent a spatial distribution of the sensitivity of the at least two RF transmit coils over the area under examination;
  accessing a Gs map that represents a spatial distribution of susceptibility magnetic field gradients in the area under examination;

for each RF transmit coil of the at least two RF transmit coils, calculating a value for a susceptibility magnetic field gradient to be corrected from the Gs map in combination with the $B_1$ map of the RF transmit coil;

for each RF transmit coil of the at least two RF transmit coils, calculating a time delay of the excitation pulse based on the susceptibility magnetic field gradient to be corrected, a slice gradient to be applied during the excitation pulse, and an echo time of the imaging sequence;

calculating a complex weighting factor for scaling a pulse profile for each RF transmit coil of the at least two RF transmit coils to achieve an as uniform as possible deflection of the magnetization by the excitation pulse over the area under examination, wherein the calculation takes into account at least the $B_1$ maps; and passing through the imaging sequence, wherein, during a simultaneous application of a slice gradient, the at least two RF transmit coils each emit an excitation pulse with the calculated time delay and with a pulse profile scaled according to the calculated complex weighting factors.

15. The non-transitory computer-readable storage medium of claim 14, wherein the Gs map is calculated from a $B_0$ map that represents the spatial distribution of a main magnetic field inhomogeneity in the area under examination.

16. The non-transitory computer-readable storage medium of claim 15, wherein for the calculation of the Gs map, a linear dependence of the susceptibility magnetic field gradient on the magnetic field inhomogeneity stored in the $B_0$ map is assumed.

17. The non-transitory computer-readable storage medium of claim 14, wherein accessing the Gs map comprises accessing a standard susceptibility distribution that is stored in a database for a body part to be examined.

18. The non-transitory computer-readable storage medium of claim 15, wherein a person to be examined is positioned in the area under examination before the accessing of the $B_1$ maps, and wherein before the accessing of the $B_1$ maps, the instructions further comprise determining the $B_0$ map, the $B_1$ maps, or the $B_0$ map and the $B_1$ maps by $B_0$ mapping methods, $B_1$ mapping methods, or $B_0$ mapping methods and $B_1$ mapping methods, respectively.

* * * * *